(12) United States Patent
Bansal

(10) Patent No.: US 7,239,177 B2
(45) Date of Patent: Jul. 3, 2007

(54) HIGH VOLTAGE TOLERANT OFF CHIP DRIVER CIRCUIT

(75) Inventor: Jai P. Bansal, Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 137 days.

(21) Appl. No.: 11/107,607

(22) Filed: Apr. 15, 2005

(65) Prior Publication Data

US 2005/0275432 A1 Dec. 15, 2005

Related U.S. Application Data

(60) Provisional application No. 60/578,370, filed on Jun. 9, 2004.

(51) Int. Cl.
*H03K 19/0175* (2006.01)

(52) U.S. Cl. .............................. 326/80; 326/56; 326/57; 326/82

(58) Field of Classification Search ............ 326/56–58, 326/68, 80–83; 327/108–112
See application file for complete search history.

(56) References Cited

U.S. PATENT DOCUMENTS 5,396,128 A * 3/1995 Dunning et al. .............. 326/68
6,323,684 B1 * 11/2001 Oshima ....................... 326/81

\* cited by examiner

*Primary Examiner*—Anh Q. Tran
(74) *Attorney, Agent, or Firm*—Mark A. Wurm; Daniel J. Long

(57) ABSTRACT

An off chip driver circuit includes a pre-driver circuit and a driver circuit. Driver data and enable inputs are decoded in the pre-driver circuit to provide independent inputs to pull up and pull down transistors in the driver circuit. The enable input keeps the driver circuit in the active or high impedance modes. A feedback signal generated by the driver output and the driver enable signals controls an inverter circuit within the driver circuit to provide proper biasing conditions at the gate of the pull up transistor. This feed back provides fast switching times for the driver circuit and prevents gate oxide of all the transistors from being overstressed by the external high voltage signal.

16 Claims, 2 Drawing Sheets

HIGH VOLTAGE TOLERANT OFF CHIP DRIVER CIRCUIT

RELATED APPLICATIONS

This patent application claims the benefit of the earlier-filed U.S. Provisional Patent Application entitled "High Voltage Tolerant Off Chip Driver Circuit" having Ser. No. 60/578,370 which was filed on Jun. 9, 2004.

FIELD OF THE INVENTION

The invention relates to off chip driver circuits used in semiconductor components, and in particular, the manner is which such off chip driver circuits relate to CMOS off chip driver circuits.

BACKGROUND

ASIC (Application Specific Integrated Circuit) components fabricated in older semiconductor processes were designed to operate at higher power supply voltage (5 volts was the standard power supply voltage for many years). However, ASIC components designed for use in newer semiconductor processes can only support lower operating power supply voltages (3.3 volts or lower). In a large number of system applications, components in the older and newer processes communicate with each other. Consequently, ASICs that are in systems that can only support lower power supply voltages need high voltage tolerant input and/or output driver circuits. In the prior art, high voltage tolerant off chip driver circuits have drawbacks such as high leakage from output pad to ground or power supply, over-stressing of transistor junctions because of high voltage external signal levels, and increased transition delays and excessive power dissipation.

An example of a prior art off chip driver circuit is disclosed in U.S. Pat. No. 5,151,617. A circuit diagram from that patent is reproduced herein as FIG. 1. This design operates at 3.3 volts power supply (Vdd), and it communicates with another design, which produces a 0 to 5 Volt signal level at the common node (Output Pad) of the two drivers. While this design protects all the transistors in the circuit from being over stressed by an external 5 volt signal, it has its shortcomings.

In active mode when the driver input switches from high to low level, outputs of the pre-driver circuit, nodes 1 and 2, switch from low to high. Initially the transmission transistor Tp1 is 'Off' and transistor Tn1 is 'On'. Tn1 produces a voltage (Vdd−Vtn) at the gate of the p-channel pull-up transistor Tp3, which stays partially 'On' until driver output reaches well below (Vdd−Vtp). Vtn and Vtp are the threshold voltages of the n-channel and p-channel transistors respectively. This condition results in longer high to low transition time. During high to low transition, n-channel pull down transistor Tn3 turns on faster and p-channel pull up transistor Tp3 takes a longer time to turn 'Off' completely, which results in high short circuit or flush through current from Vdd to ground through the pull-up and pull-down transistors for a longer time. This short circuit current causes higher power dissipation. This power dissipation is due to higher current drawn by the circuit in its operation and will require a larger power supply and produce a higher module and circuit board temperature.

When the driver circuit in FIG. 1 is in a high impedance mode and its output is higher than Vdd due to an external signal, Tp2 turns on and provides higher voltage at the gate of transistor Tp3 and turns Tp3 off so that no current flows through Tp3 to Vdd from the external source. Since transistor Tn2 is in series with transistor Tn3, the external high voltage is reduced to below (Vdd−Vtn) across Tn3. Transistor Tp4 generates bias for the Nwell region in which transistors Tp1, Tp2, and Tp3 are formed.

The art would therefore benefit from an off chip driver circuit that has high performance and low power dissipation.

SUMMARY OF AN EMBODIMENT

An embodiment of the invention is an off chip driver circuit that includes pre-driver and driver circuits. Data and enable inputs to the off chip driver are decoded in the pre-driver to provide independent inputs to the pull up and pull down transistors of the driver. A feedback signal is generated by the driver output and its enable input signals. This feedback signal controls the inverter circuit that provides proper biasing conditions at the gate of a p-channel pull up transistor. This method of biasing the gate of the pull up transistor turns the pull up transistor completely off during high to low transition at the driver input. This reduces the transition time and flush through current through the pull up and pull down transistors. When the present off chip driver is in the high impedance mode and its output is switched between ground and high voltage (5.5 volts) by an external signal, an inverter circuit isolates the pre-driver circuit from the driver circuit and protects gate oxides of all the transistors from over voltage stress.

DETAILED DESCRIPTION

Figure 1:
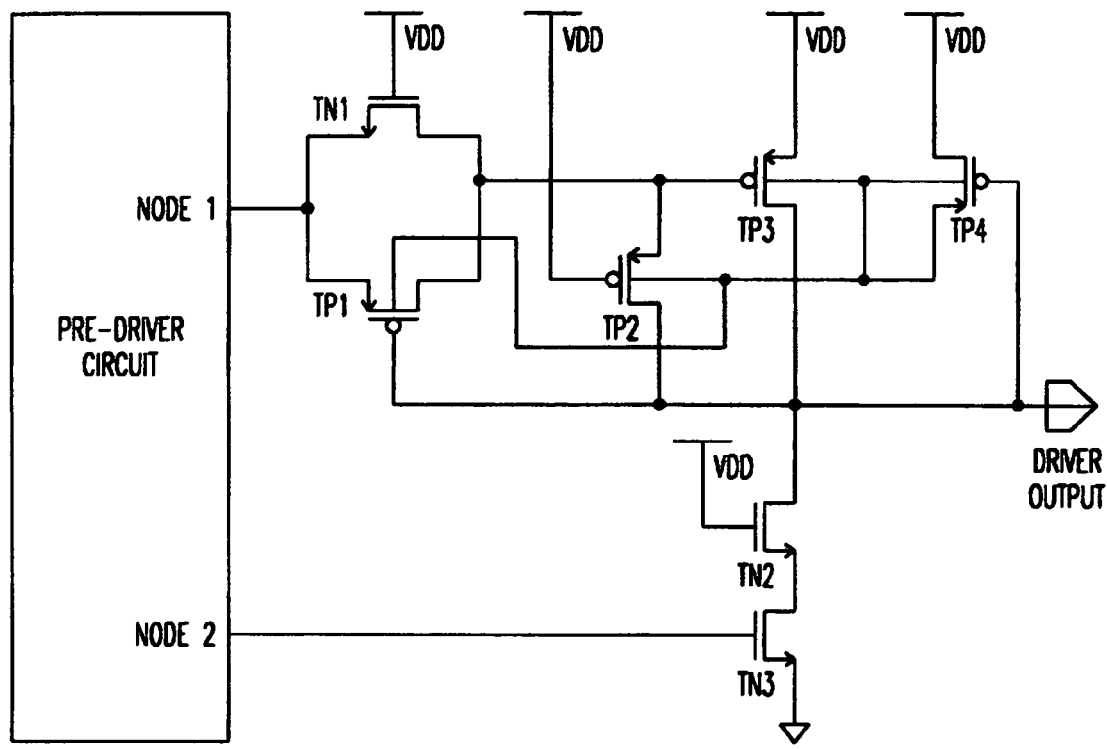
FIG. 1 is a schematic of an off chip driver circuit of the prior art.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
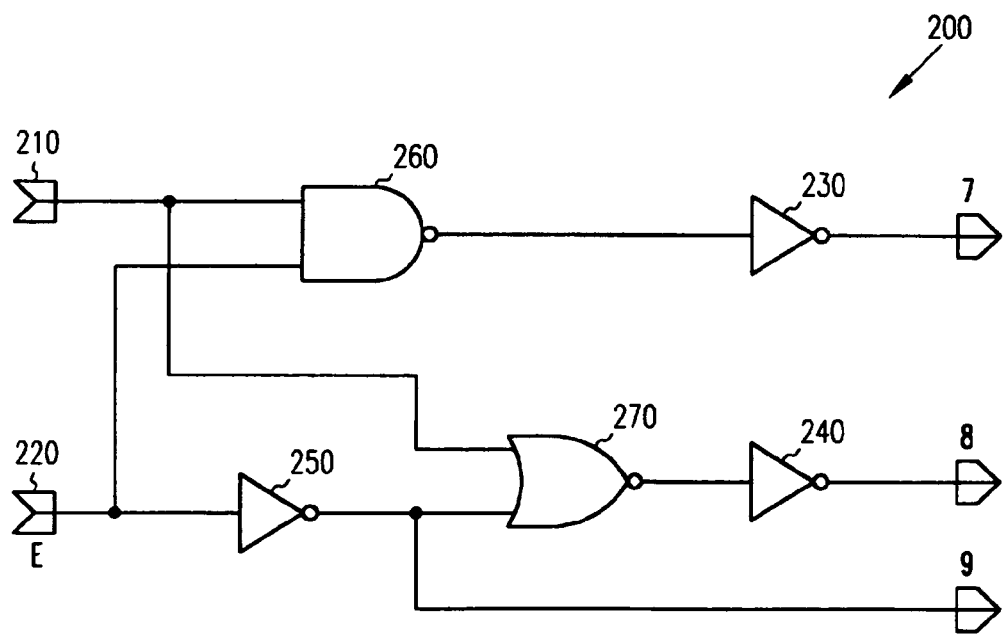
FIG. 2 is a schematic of an embodiment of a pre-driver circuit of the invention.
Figure 3:
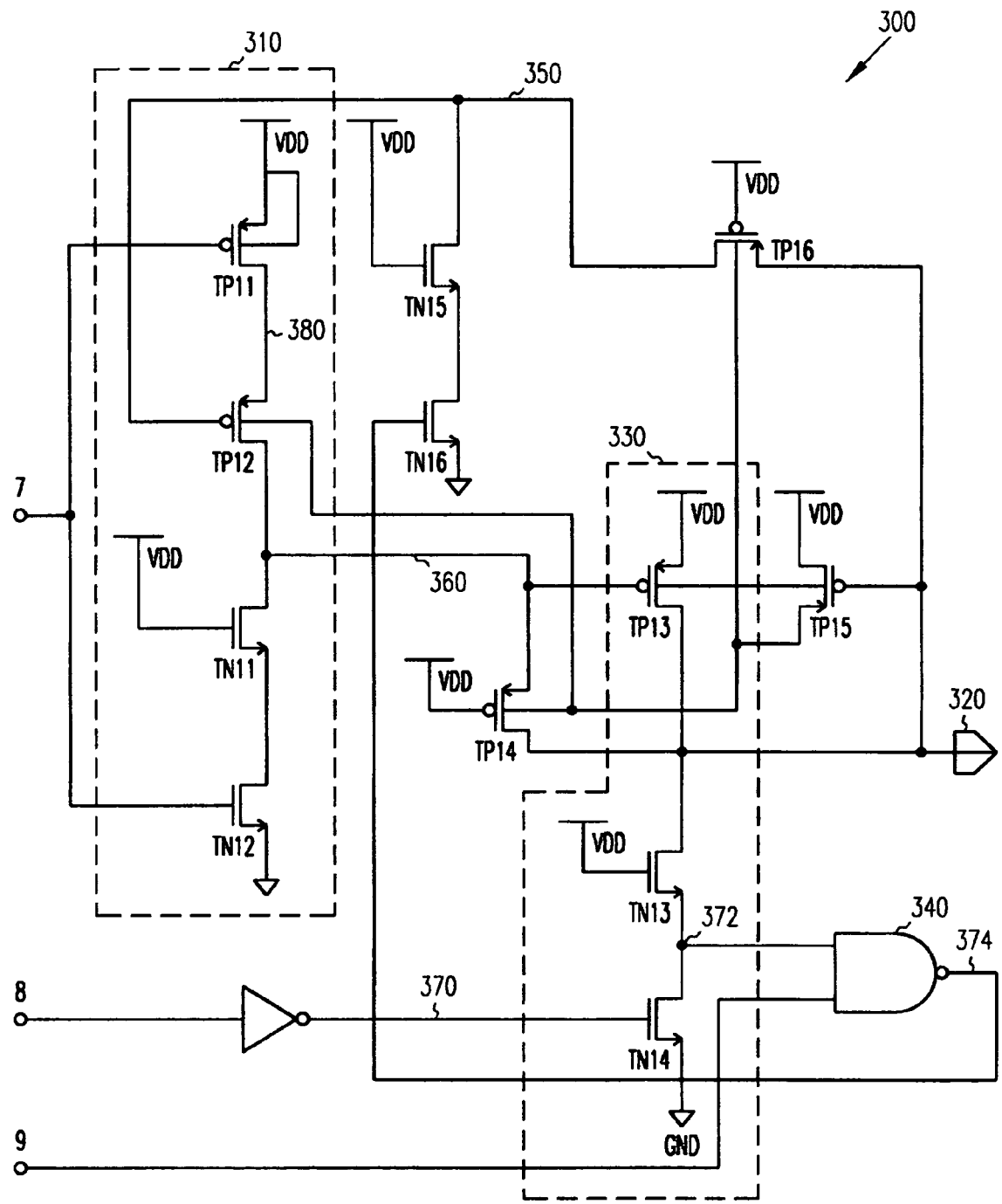
FIG. 3 is a schematic of an embodiment of a driver circuit of the invention.

In an embodiment of the invention, an off chip driver circuit has a pre-driver circuit 200 and a driver circuit 300 which are illustrated in FIGS. 2 and 3 respectively. The driver data input 210 and the driver enable input 220 are decoded in the pre-driver circuit 200, which through NAND circuit 260, NOR circuit 270, and inverters 230, 240, and 250, generates proper logic levels for the driver circuit 300. The driver circuit 300 has two operating modes, an active switching mode in which the driver is enabled, and an high impedance or tri-state mode in which the driver is disabled (and the circuit is in the non-switching mode). The enable and disable modes are controlled by the driver enable input E (220) shown in FIG. 2. The logic levels generated by the pre-driver circuit 200 at its output nodes 7, 8, and 9 are given below:

| Driver Mode | Driver Enable | Driver Input | Node 7 | Node 8 | Node 9 |
| --- | --- | --- | --- | --- | --- |
| Active | high | high | high | high | low |
| Active | high | low | low | low | low |
| High Impedance | low | high or low | low | high | high |

Pre-driver circuit output nodes 7, 8, and 9 are connected to the driver circuit input nodes 7, 8, and 9 shown in FIG. 3. The driver circuit 300 includes an isolation inverter circuit 310 configured with transistors Tp11, Tp12, Tn11, and Tn12. The isolation inverter circuit 310 prevents an external high voltage signal, at the driver output 320 from being transmitted to pre-driver circuit transistors used to configure the NAND, NOR, and inverter circuits shown in FIG. 2. The output stage 330 of the driver 300 includes a p-channel pull up transistor Tp13 and n-channel pull down transistors Tn13 and Tn14. Transistors Tn13 and Tn14 are stacked to avoid punch through when the external signal at the driver output 320 is a high voltage signal (5 volts). The gate of the transistor Tn13 is connected to the driver power supply (Vdd=3.3 Volts). Transistor Tn13 stays 'On', providing a voltage level at node 372 equal to (Vdd−Vtn) when output is high (Vdd) in active mode or output is at high voltage in the high impedance mode.

Node 372 is at low logic level or ground when the driver output 320 is at logic low level in active or high impedance mode. A two input NAND circuit 340 is controlled by the driver enable signal E (220) and the driver output signal reflected at node 372. Depending on the active or high impedance mode of the driver 300, the NAND circuit 340 generates the proper logic level at node 350 and at the gate terminal of transistor Tp12, which in turn controls the operation of the isolation inverter circuit 310 configured with Tp11, Tp12, Tn11, and Tn12. This will be explained in detail later. Transistor Tn15 is stacked with transistor Tn16 to avoid punch through of Tn16 when the external signal at the driver output 320 is high voltage (5 Volts).

P-channel Transistor Tp15 generates the bias for the floating Nwell in which p-channel transistors Tp12 through Tp16 are formed.

Operation of an Embodiment of the Off Chip Driver Circuit in the Active Mode

When the driver circuit 300 is in the active or enabled mode, driver enable input E (220) is high and node 9 will be at low level. Node 374, the output of the circuit NAND 340 will be at a high level, transistors Tn15 and Tn16 will be 'On', and node 350 will be at low or ground level, thereby providing a low level at the gate of transistor Tp12. In the isolation circuit 310, Tp12 and Tn11 will be 'On' and the isolation circuit will function like an inverter circuit. Nodes 7 and 8 will be at the same logic level as that of the driver data input 210. Nodes 360 and 370 will be at the complement of the driver data input level 210. So when the driver input 210 is high, node 360 will be low, pull up transistor Tp13 will be 'On', node 370 will be low, transistor Tn14 will be 'Off', and the driver output 320 will be high or at the same voltage level as power supply (Vdd). P-channel Transistor Tp16 will be 'Off', preventing any leakage current from the driver output 320 to node 350 and to ground through Tn15 and Tn16.

Operation of an Embodiment of the Off Chip Driver Circuit in High Impedance Mode When the driver circuit 300 switches from active mode when its data input was at a low level to high impedance mode, the driver input enable 220 will be at low level, node 7 will be low, node 8 will be high, and node 9 will be high. Since the driver output 320 was at low level before switching to high impedance mode, node 372 will stay at a low level and node 374 will be high, Tn15 and Tn16 will be 'On', node 350 and the gate of transistor Tp12 will be at a low level. The isolation circuit 310 again will function as an inverter circuit. Transistor Tn12 will be completely 'Off', preventing any leakage current from Vdd to ground in the isolation inverter circuit. A low level at node 7 will provide a high level equal to the power supply (Vdd) at the gate of the p-channel pull up transistor Tp13, keeping it completely 'Off'. A high level at node 8 will provide a low level at the gate of the pull down transistor Tn14, keeping it 'Off'.

When the driver circuit 300 switches from active mode when its data input was at a high level to high impedance mode, the driver enable 220 will be low, node 7 will be low, node 8 will be high, and node 9 will be high. Node 374 will switch to low level, tuning off the transistor Tn16. Since node 350 was low before the driver 300 switched to high impedance mode, node 350 may charge to a small voltage level due to the gate to node 350 capacitance coupling of transistors Tn15 and Tp16, a potential displacement effect across a capacitor. This voltage level at node 350 still will be low enough to keep transistor Tp12 'On' and the isolation circuit 310 functioning like an inverter. Node 7 will be low, transistor Tn12 will be completely 'Off', there will be no leakage current from Vdd to ground in the isolation circuit 310, and again node 360 or the gate of the pull up transistor Tp13 will be biased to Vdd level keeping it completely 'Off'.

The driver 300 is in the high impedance mode and its output is switched between ground and high voltage by the external signal. When the external signal is low, node 372 will be low, node 374 will be high, and transistors Tn15 and Tn16 will be 'On'. The gate of Tp12 will be at a low level, and the isolation circuit 310 will act like an inverter providing an up level equal to Vdd at the gate of transistor Tp13 and keeping it completely 'Off'. A high level at node 8 will provide a low level equal to ground at the gate of transistor Tn14 and keeping it 'Off' as well. When the external signal is high (5 volts), node 372 will be high, node 9 will be high, node 374 will be low and transistor Tn16 will be 'Off'. A level of 5 volts at output will turn 'On' transistor Tp16 with its gate voltage at Vdd and node 350 will be at 5 volts. Since node 7 was low, transistor Tp11 will be 'On' and node 380 will be at Vdd or 3.3 Volts. A level of 5 volts at the driver output 320 will also turn 'On' the transistor Tp14, connected across the gate and the drain of pull up transistor Tp13, providing 5 volts at the gate of Tp13 and keeping it 'Off'. Voltage across all the p-channel transistor junctions, gate to source, gate to drain, gate to substrate, and gate to Nwell is at Vdd or below Vdd levels. The high voltage (5 volts) external signal at the output 320 of the driver circuit will not over stress any of the transistors.

When the driver 300 switches from high impedance mode to active mode, driver enable 220 switches from low to high level. Node 374 switches to high level, which turns on the transistor Tn16, bringing node 350 and the gate of the transistor Tp12 to low level, conditioning the isolation circuit 310 into an inverter function before node 7 responds to the change in the driver's mode from high impedance to active.

Other Applications of an Embodiment of the Off Chip Driver Circuit

Embodiments of an off-chip driver circuit of the invention can be used to meet cold spare requirements. In cold spare mode, power supply applied to the off chip driver is zero volts, and the output is dotted with other active components which may be switches between ground and power supply (Vdd). This condition will not cause any over stress condition for this circuit and no damage to this off chip driver circuit.

In many applications, core circuits of ASICs are operated at still lower power supply voltage. For example, if the power supply voltage for the core circuit is 2.5 volts, the off chip driver circuit provides a 3.3 volt signal at its output pad, and it interfaces with another component which provides a 5 volt signal. In the pre-driver circuit 200 embodiment, inverters 230, 240 and 250 may be replaced with level converter circuits which will convert 2.5 volt signals to 3.3 volt signals at nodes 7, 8, and 9. The operation of the off chip driver circuit will be the same as described earlier.

In newer technologies power supply voltages are being reduced still further. Embodiments of an off chip driver circuit configuration as described herein are applicable to lower voltage levels. Persons of skill in the art will realize that the selection of transistor sizes will achieve certain performance requirements.

In the foregoing detailed description of embodiments of the invention, various features are grouped together in one or more embodiments for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

The invention claimed is:

1. An off-chip circuit comprising:
   a pre-driver circuit; and
   a driver circuit;
   wherein an output of said pre-driver circuit is coupled to an input of said driver circuit;
   wherein said pre-driver circuit comprises:
      a driver data input node; and
      a driver enable signal node;
   wherein said driver circuit comprises:
      an output node; and
      a push pull circuit connected to said output node and a power supply;
   wherein said push pull circuit comprises:
      a first p-channel transistor;
      a first n-channel transistor coupled to said first p-channel transistor; and
      a second n-channel transistor, said second n-channel transistor connected in series to said first n-channel transistor, said first n-channel transistor and said second n-channel transistor positioned between said output node and ground;
   wherein the gate of said first n-channel transistor is connected to said power supply to reduce an external signal level at the drain of said second n-channel transistor to avoid punch through of said second n-channel transistor;
   a feedback NAND circuit controlled by said driver enable signal node and said output node;
   an isolation circuit, said isolation circuit comprising:
      a second p-channel transistor;
      a third p-channel transistor, said second p-channel transistor and said third p-channel transistor connected in series between a first reference node and said power supply;
      a third n-channel transistor; and
      a fourth n-channel transistor;
   wherein said third p-channel transistor is coupled to said third n-channel transistor, and wherein said third n-channel transistor and said first n-channel transistor operate as transmission transistors;
   wherein the gate of said third p-channel transistor is connected to a second reference node; and
   wherein the gate of said third n-channel transistor is connected to said power supply to avoid punch through of said fourth n-channel transistor;
      a fifth n-channel transistor; and
      a sixth n-channel transistor, said fifth n-channel transistor and said sixth n-channel transistor connected in series between said second reference node and ground;
   wherein the gate of said fifth n-channel transistor is connected to said power supply to avoid punch through of said sixth n-channel transistor;
   wherein the gate said sixth n-channel transistor is connected to an output of said NAND circuit; and
   wherein said fifth n-channel transistor and said sixth n-channel transistor provide proper bias control for said isolation circuit and the output of said first p-channel transistor.

2. The off-chip circuit of claim 1, wherein said isolation circuit generates a gate bias for the output of said first p-channel transistor.

3. The off-chip circuit of claim 1, further comprising:
   a fourth p-channel transistor, said gate of said fourth p-channel transistor connected to said power supply, said source of said fourth p-channel transistor connected to said output node, and said drain of said fourth p-channel transistor connected to said second reference voltage node; and a fifth p-channel transistor, the gate of said fifth p-channel transistor connected to said power supply, said fifth p-channel transistor positioned between said output node and said first reference node.

wherein said fourth p-channel transistor blocks the electrical path from said output node to said second reference voltage node when said driver is in an active mode; and wherein said fifth p-channel transistor provides high voltage bias to the gate of said first p-channel transistor thereby keeping said first p-channel transistor off when an external signal is high.

4. The off-chip circuit of claim 3, wherein said driver circuit is in a high impedance mode, wherein an external signal at said output node is 5 volts, and further wherein said fifth p-channel transistor turns on and produces a 5 volt signal at said first reference node.

5. The off-chip circuit of claim 3, wherein said driver circuit is in an high impedance mode, wherein said output node interfaces with an external high voltage signal, wherein a feed back signal generated by said NAND circuit turns 'Off' said sixth n-channel transistor and prevents any leakage current from said external high voltage signal from entering said output node.

6. The off-chip circuit of claim 3, wherein said external high voltage signal comprises approximately 5 volts.

7. A circuit comprising:
a predriver circuit; and
a driver circuit;
wherein said predriver circuit comprises:
a data input;
a driver enable;
a first NAND gate;
a NOR gate;
a first inverter, a second inverter, and a third inverter; and
a first output, a second output and a third output;
wherein said data input is coupled to a first input of said first NAND gate and a first input of said NOR gate;
wherein said driver enable is coupled to a second input of said first NAND gate and a second input of said NOR gate;
wherein said first inverter is coupled to said driver enable and said second input of said NOR gate; and
further wherein said second inverter is coupled to the output of said first NAND gate, and said third inverter is coupled to the output of said NOR gate;
wherein said driver circuit comprises:
a first input, a second input, and a third input;
an isolation circuit, said isolation circuit coupled to said first input;
an output stage, said second input coupled to said output stage; and
a second NAND gate, a first input of said second NAND gate coupled to said output stage, and a second input of said NAND gate coupled to said third input;
wherein said isolation circuit is coupled to said output stage; and
wherein said first output is coupled to said first input, said second output is coupled to said second input, and said third output is coupled to said third input.

8. The circuit of claim 7, wherein said isolation circuit comprises:
a first p-channel transistor and a second p-channel transistor; and
a first n-channel transistor and a second n-channel transistor;
wherein said first p-channel transistor is stacked with said second p-channel transistor;
wherein said first n-channel transistor is stacked with said second n-channel transistor; and
wherein said second p-channel transistor is coupled to said first n-channel transistor.

9. The circuit of claim 8, wherein said output stage comprises:
a third n-channel transistor stacked with a fourth n-channel transistor; and
a third p-channel transistor coupled to said third n-channel transistor.

10. The circuit of claim 7, further comprising a fourth p-channel transistor, said fourth p-channel transistor coupling said isolation circuit to said output stage.

11. The circuit of claim 7, further comprising:
a fifth n-channel transistor stacked with a sixth n-channel transistor;
wherein the drain of said fifth n-channel transistor is coupled to the gate of said second p-channel transistor; and
further wherein said gate of said sixth n-channel transistor is coupled to the output of said second NAND gate.

12. The circuit of claim 7, further comprising:
a fifth p-channel transistor; and
a sixth p-channel transistor;
wherein the drain of said fifth p-channel transistor is coupled to the drain of said fifth n-channel transistor; and
wherein the source of said fifth p-channel transistor is coupled to the gate of said sixth p-channel transistor and said output stage.

13. A method comprising:
providing a pre-driver circuit comprising:
a data input;
an enable input; and
an output;
providing an off chip driver circuit comprising:
an input;
an inverter;
an isolation circuit;
an output;
pull up transistors; and
pull down transistors;
wherein an output of said pre-driver circuit is coupled to an input of said off chip driver circuit;
decoding said data input and said enable input in said pre-driver circuit;
providing independent inputs to said pull up and pull down transistors in said off chip driver circuit;
generating a feedback signal in said off chip driver circuit;
controlling said inverter circuit with said feedback signal;
biasing the gate of one of said pull up transistors via said inverter;
turning said one of said pull up transistors completely off during a high to low transition at said input of said off chip driver circuit;
reducing the transition time and flush through current through said pull up and pull down transistors;
placing said output of said off chip driver circuit in high impedance mode;

switching said output of said off chip driver circuit from ground to approximately 5 volts;

isolating said pre-driver circuit from said off chip driver circuit via said inverter; and generating a bias control signal from a bias control generator circuit during said isolating step and feeding said bias signal to said isolation circuit; said bias control generator circuit comprising a first n-channel and a second n-channel transistor connected in series; the first n-channel transistor coupled between the gate of a p-channel inverter transistor and ground through the second n-channel transistor and having its gate connected to VDD; the second n-channel transistor coupled between the first n-channel transistor and ground having its gate controlled by the output of a NAND gate;

thereby protecting gate oxides of said transistors from over voltage stress.

14. The method of claim 13, further comprising:

putting said off chip driver circuit into an active mode;

setting said driver enable to high; and setting said driver input to high;

thereby producing a high output at a first output node of said pre-driver circuit, producing a high output at a second output of said pre-driver circuit, and producing a low output at a third output of said pre-driver circuit.

15. The method of claim 13, further comprising:

putting said off chip driver circuit into an active mode;

setting said driver enable to high; and setting said driver input to low;

thereby producing a low output at a first output node of said pre-driver circuit, producing a low output at a second output of said pre-driver circuit, and producing a low output at a third output of said pre-driver circuit.

16. The method of claim 13, further comprising:

putting said off chip driver circuit into a high impedance mode;

setting said driver enable to low; and setting said driver input to either high or low;

thereby producing a low output at a first output node of said pre-driver circuit, producing a high output at a second output of said pre-driver circuit, and producing a high output at a third output of said pre-driver circuit.

* * * * *